United States Patent [19]

Sugaya et al.

[11] Patent Number: 5,796,149

[45] Date of Patent: Aug. 18, 1998

[54] SEMICONDUCTOR MEMORY USING DIFFERENT CONCENTRATION IMPURITY DIFFUSED LAYERS

[75] Inventors: Fumitaka Sugaya; Yasuo Sato, both of Tokyo, Japan

[73] Assignee: Nippon Steel Corporation, Tokyo, Japan

[21] Appl. No.: 524,672

[22] Filed: Sep. 8, 1995

[30] Foreign Application Priority Data

Sep. 9, 1994 [JP] Japan ................... 6-242099
Mar. 10, 1995 [JP] Japan ................... 7-079819

[51] Int. Cl.$^6$ ................... H01L 29/76; H01L 29/94
[52] U.S. Cl. ................... 257/391; 257/401; 257/408; 365/104
[58] Field of Search ................... 257/391, 401, 257/408; 365/104

[56] References Cited

U.S. PATENT DOCUMENTS

| | | | |
|---|---|---|---|
| 4,467,520 | 8/1984 | Shiotari | 29/576 |
| 4,837,181 | 6/1989 | Galbiati et al. | 437/45 |
| 5,592,012 | 1/1997 | Kubota | 257/391 |

OTHER PUBLICATIONS

IEEE Transactions on Computers, vol. C-35, No. 2, Feb. 1986, A Survey of Multivalued Memories.

Primary Examiner—Donald Monin
Attorney, Agent, or Firm—Pollock, Vande Sande & Priddy

[57] ABSTRACT

A semiconductor memory which includes first and second memory cells, wherein the first memory cells include first MOS transistors each having impurity diffused layers provided inside of both of a source and a drain to expanding source and drain regions, the second memory cells include second or third MOS transistors each having an impurity diffused layer provided inside of one of a source and a drain or include fourth MOS transistors each having no impurity diffused layer provided inside of either thereof, as well as a method for fabricating the semiconductor memory. Differences in threshold voltage between the first and second to fourth MOS transistors are utilized as differences in storage status between the first and second memory cells so that data "0" or "1" is stored in each memory cell. There are also provided a semiconductor memory wherein differences between the first to fourth MOS transistors in the drain-source current flowing through the transistors when subjected to application of an identical gate voltage thereto are utilized to store four sorts of data in one memory cell, and provided a method for fabricating the semiconductor memory.

12 Claims, 9 Drawing Sheets

FIG. IIA PRIOR ART

FIG. IIB PRIOR ART

SEMICONDUCTOR MEMORY USING DIFFERENT CONCENTRATION IMPURITY DIFFUSED LAYERS

BACKGROUND OF THE INVENTION

1. Field of the Invention

The present invention relates to a semiconductor memory and a method for fabricating the device and more particularly, to a read-only nonvolatile memory called mask ROM and a method for fabricating the memory.

2. Description of the Related Art

Among read-only nonvolatile memories (ROMs), ROMs which are programmable in wafer processing steps, that is, mask ROMs, have a feature that the mask ROM is simpler in its memory cell structure than DRAM, which results in realization of a remarkably high integration and a large capacity of ROM and fabrication thereof with low costs, i.e., on a mass production basis.

Typical examples ones of the programming systems of conventional mask ROMs include (1) a system in which connection or non-connection of a bit line to a MOS transistor included in a memory cell corresponds to memory status "1" or "0" respectively, (2) a system in which selected MOS transistors included in memory cells are an earlier fabrication stage, however, gate oxide films to set the threshold voltage high and a difference in the threshold voltage between the selected transisters and the other transistors is utilized as the memory status, and (3) a system in which selected MOS transistors included in memory cells are subjected at their channel zones to an ion implantation for controlling the threshold voltage and a difference in the threshold voltage between the selected transistors and the other MOS transistors is utilized as the memory status.

Explanation will be made as to the above system (2) by referring to FIGS. 11A and 11B.

Figure 11A:
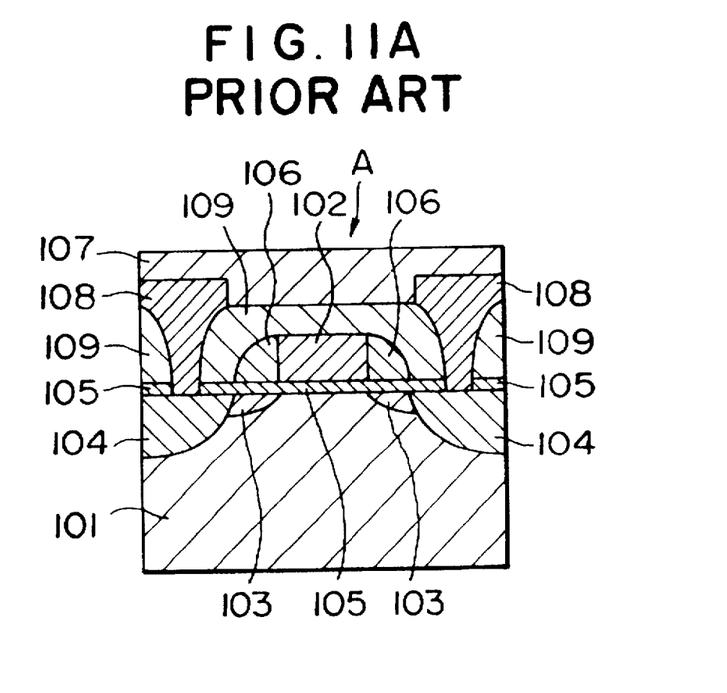
FIGS. 11A and 11B are schematic cross-sectional views of two types of memory cells for use in a conventional mask ROM.

In such a memory cell A as shown in FIG. 11A, a gate electrode 102 is formed on a P type silicon substrate 101 through a gate oxide layer 105. Formed on both sides of the gate electrode 102 are side wall insulating films 106. Formed in the P type silicon substrate 101 on both sides of the gate electrode 102 are N type low-concentration impurity diffused layers 103 and N type high-concentration impurity diffused layers 104, thus establishing a MOS transistor of a lightly doped drain (LDD) structure type. Each of the N type high-concentration impurity diffused layers 104 is connected with an aluminum (Al) wiring 108 through a corresponding contact hole made in an interlayer insulating film 109. Reference numeral 107 denotes a protection film.

Figure 11B:
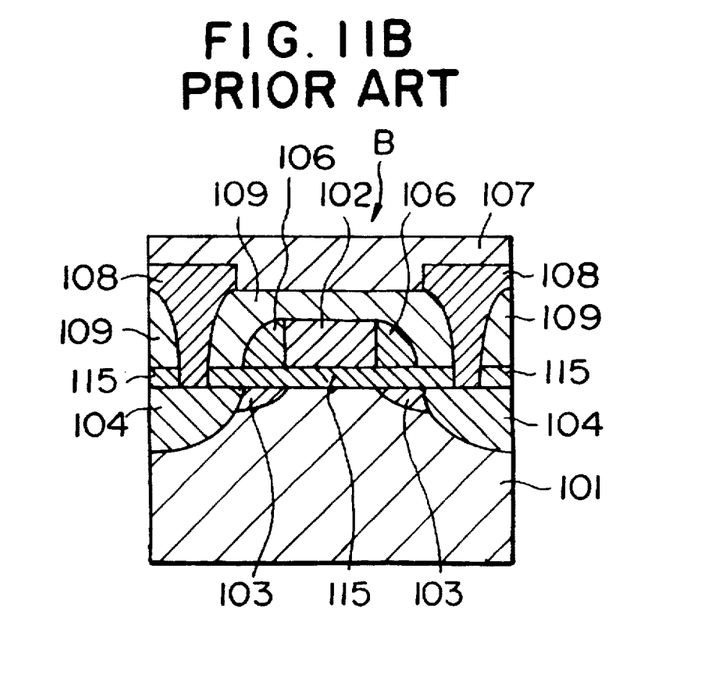

Such a memory cell B as shown in FIG. 11B, on the other hand, has substantially the same structure as the memory cell A, except that a fairly-thick gate oxide film 115 is formed in the memory cell B. In particular, the provision of the fairly-thick gate oxide film 115 results in the fact that the threshold voltage of the MOS transistor of the memory cell B is considerably higher than that of the memory cell A so that the MOS transistor can be prevented from being turned ON by an ordinary gate voltage. In other words, when an identical gate voltage is applied to the memory cells A and B, one of the cells is turned ON and the other is not turned ON, providing memory statutes of "1" and "0" respectively.

In the aforementioned system (1), the formation or non-formation of a contact between the N type high-concentration impurity diffused layer 104 and the Al wiring 108 in FIG. 11A results in the formation of memory cells connected or not connected to the bit line, which differences correspond to memory statuses "1" and "0". In the system (3), immediately after execution of inter-element separation, only the specific memory cell region is subjected to the ion implantation for control of the threshold voltage to prepare such a MOS transistor of the memory cell as shown in FIG. 11A, so that the differences in the threshold voltage of the MOS transistor between the memory cells subjected and not subjected to the ion implantation for controlling the threshold voltage are made to correspond to the memory statuses "1" and "0" respectively.

The mask ROM can generally realize a higher integration when subjected to a programming process at an earlier fabrication stage, however, this also disadvantageously involves a problem that a period of time required from reception of program data to delivery of its product, that is, a turn around time (TAT) is prolonged. That is, the system (1) has the problem that it is difficult to obtain a high integration though the TAT is short, while the system (3) has the problem that the TAT is long though it is possible to realize a high integration. An additional problem with the system (3) is that the number of steps is increased because of the necessity of the ion implantation step for controlling the threshold voltage. Further, the system (2) is flawed in that the step of making thick the gate oxide film 115 of the memory cell B thick may be implemented by forming the gate oxide film 115 simultaneously with the field oxide film, in which case the TAT becomes longer than that of the system (3).

In a semiconductor memory, it is common practice to store one-bit of data in a single memory cell. However, since miniaturization of the device or wiring is getting close to its limit, there has been proposed a memory of multi-valued storage type (multi-valued storage semiconductor memory) wherein a plurality of bits of data are stored in a single memory, cell, as shown in, e.g., a paper entitled "A Survey of Multivalued Memories", David A. Rich, IEEE Transaction on Computers, Vol.C-35, No. 2, February 1986.

Described in the above reference is a method for setting a plurality of threshold voltages of the cell transistors as well as a method for setting a plurality of widths of active regions of the cell transistors, in order to obtain a multivalued mask ROM wherein a plurality of bits of data are stored in each of memory cells of the mask ROM.

In the former method for setting a plurality of threshold voltages in the above reference, ion implantation of a plurality of times causes the threshold voltage of each memory cell transistor vary so that respective data having a plurality of bits corresponds to the plurality of threshold voltages. In this method, in view of the fact that different thresholds of the transistors produce different currents flowing through the transistors in the ON state thereof, data reading is carried out by detecting the value of the current flowing through the bit line when the transistor is in its ON state. In the latter method for setting a plurality of widths of the active regions, on the other hand, different widths corresponding to different data are set to the active regions of memory cells. The data reading is carried out by detecting the current flowing through the active region because the different widths of the active regions produce different currents flowing therethrough when the cells are in the ON state.

Among the aforementioned conventional multivalued mask ROMs, the ROM having memory cells set by a plurality of threshold voltages, is advantageous in that the element integration can be increased, but is disadvantageous in that a plurality of ion implantation steps is required and thus the increased number of steps involves a reduction of workability and an increase of fabrication costs. Meanwhile, the method for setting a plurality of widths of the action regions can avoid any increase in the number of fabrication steps because one-time photolithography allows the different widths to be set to the active regions, but in order to realize sufficient sensitivity for reading data, it requires differences between the plurality of the widths of active regions to be made larger than a certain value, which blocks realization of a device having a higher integration.

SUMMARY OF THE INVENTION

It is therefore a first object of the present invention to provide a method for fabricating a mask ROM having a short TAT and a simple arrangement.

In accordance with a first aspect of the present invention, the above object is attained by providing a semiconductor memory which comprises a first memory cell including a first MOS transistor having a pair of relatively high concentration first impurity diffused layers of a second electric conduction type provided within a semiconductor substrate of a first electric conduction type on both sides of a gate electrode. A pair of relatively low concentration second impurity diffused layers of the second electric conduction type are provided within the semiconductor substrate of the first electric conduction type and inside of the first impurity diffused layers; and a second memory cell including a second MOS transistor which does not have at least one of the second impurity diffused layers.

In accordance with the first aspect of the present invention, there is provided a method for fabricating a semiconductor memory which comprises the steps of subjecting a semiconductor substrate of a first electric conduction type to patterning processes to form a pattern of gate insulating film on an area for memory cells and a pattern of gate electrodes thereon; covering the semiconductor substrate with an ion implantation mask on at least one side of each of the gate electrodes in predetermined ones of the memory cells; introducing at least one impurity of a second electric conduction type into the semiconductor substrate to have a relatively low impurity concentration with the ion implantation mask and the gate electrodes of the memory cells used as a mask; removing the ion implantation mask; forming side wall insulating films on both sides of the gate electrode of each memory cell; and introducing at least one impurity of a second electric conduction type into the memory cells of the semiconductor substrate to have a relatively high impurity concentration with the gate electrodes and the side wall insulating film used as a mask.

In the first aspect of the present invention, two types of memory cells having different threshold voltages are formed depending on the provision or non-provision of a low-concentration impurity diffused layer(s) in a MOS transistor of an LDD structure as each of the memory cells, and the two types of memory cells are made to correspond to data "1" and "0", respectively, and to store the data therein. The programming is carried out at an intermediate stage, earlier than in the aforementioned system (1) and later than in the aforementioned systems (2) and (3). Accordingly, the present invention has an intermediate feature of these systems.

A second object of the present invention is to provide a semiconductor memory which, even when it is desired to store plural-bit data in a single memory cell, can prevent the number of fabricating steps from being increased and can reduce element dimensions to realize a high integration, and to provide a method for fabricating the semiconductor memory.

In accordance with a second aspect of the present invention, the above object is attained by providing a semiconductor memory which comprises a first transistor having an impurity layer in a source side of a channel region; a second transistor having an impurity layer in a drain side of a channel region; a third transistor having impurity layers in source and drain sides of a channel region; and a fourth transistor not having any impurity layer in either of the source and drain sides of a channel region; wherein one of the first to fourth transistors is allocated to each of memory cells to record 2-bit data in each of the memory cells.

In accordance with the second aspect of the present invention, there is provided a method for fabricating a multivalued semiconductor memory which comprises the steps of forming gate electrodes on respective memory cell regions of a semiconductor substrate of a first electric conduction type through a gate insulating film; depositing a photo resist on the memory cell regions; light exposing the photo resist with use of four types of patterns according to data to be recorded in the respective memory cell regions; after the light exposing step, removing unnecessary parts of the photo resist to form predetermined mask patterns in the respective memory cell regions; irradiating an impurity ion beam on the respective memory cell regions to implant impurity ions into areas of memory cells not masked by the photo resist and to form low concentration impurity regions; forming side wall oxide films on sides of the gate electrode of each of the memory cells; and irradiating the impurity ion beam on the memory cell regions with the side wall oxide films used as a mask to implant impurity ions into areas of the regions not masked and to form a high concentration impurity region as a source or drain; wherein the presence/absence and location of the low-concentration impurity regions in the memory cells are made different from one another according to the four types of exposure patterns to form first to fourth types of transistors having mutually different electrical characteristics so as to store 2-bit data in each of the memory cells.

In the semiconductor memory in accordance with the second aspect of the present invention, the first to fourth transistors correspond to four types of transistors having different structures depending on the presence/absence and location of the impurity layer. Due to the structural differences, even when an identical gate voltage is applied to the four transistors, these transistors have different source-drain currents flowing therethrough. Accordingly, these four types of transistors are used as the transistors of the memory cells and are assigned to the memory cells depending on respective data so as to store 2-bit data in each memory cell. The data reading operation can be carried out by detecting source-drain currents flowing through the associated transistors.

In the fabricating method, after the low-concentration impurity zone is formed, the side wall oxide films are provided on both sides of the gate electrode, and then ion implantation for the source and drain is carried out with the side wall oxide films used as a mask to change electrical characteristic of the transistor based on the presence/absence and location of the low-concentration impurity zone, whereby the first to fourth transistors can be made for the memory cells according to the data to be stored therein.

DESCRIPTION OF THE PREFERRED EMBODIMENTS

A first embodiment of the present invention will be explained with reference to FIGS. 1A to 5B.

Figure 1A:
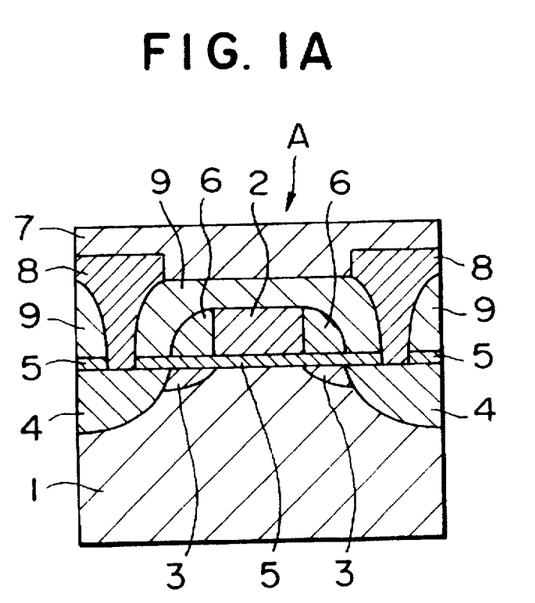
FIGS. 1A and 1B show schematic cross-sectional views of two types of memory cells for use in present invention.
Figure 1B:
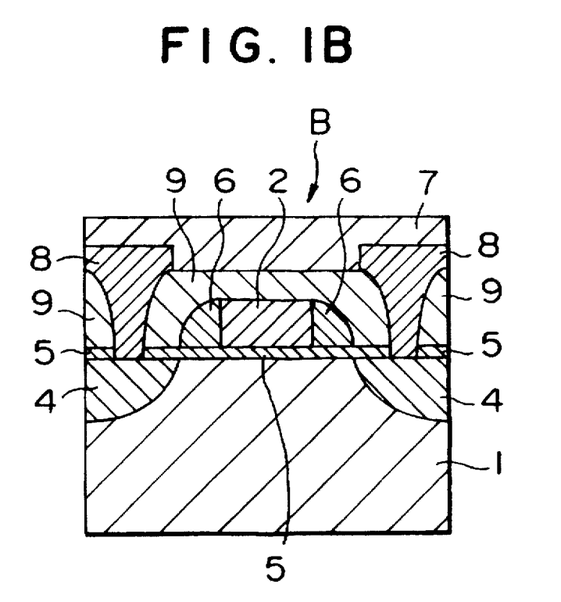

Referring first to FIGS. 1A and 1B, there are shown structures of two memory cells A and B of a mask ROM in accordance with the first embodiment of the present invention.

In such a memory cell A as shown in FIG. 1A, a gate electrode 2 is formed on a P type silicon substrate 1 through a gate oxide film 5. Side wall insulating films 6 are provided on both sides of the gate electrode 2. Also formed in the P type silicon substrate 1 are a pair of N type low-concentration diffused layers 3 in an aligned relation with the gate electrode 2 as well as a pair of N type high-concentration diffused layers 4 in an aligned relation with the side wall insulating film 6 to thereby form a MOS transistor of an LDD structure. The pair of N type high-concentration diffused layers 4 forming substantially the source and drain of the MOS transistor are connected with aluminum (Al) wirings 8 forming source and bit lines through contact holes made in an interlayer insulating film 9 respectively. Reference numeral 7 denotes a protection film.

On the other hand, such a memory cell B as shown in FIG. 1B has substantially the same structure as the memory cell A except that the pair of low-concentration diffused layers 3 are not provided in the memory cell B. Because of the absence of the low-concentration diffused layers 3, the spacing between the source and drain of the MOS transistor becomes large and a threshold voltage thereof becomes correspondingly higher than that of the memory cell A. Therefore, when a voltage between the threshold voltages of both transistors is applied to each gate electrode 2, the memory cells A and B can be designed so that the memory cell B is put in its non-conduction state while the memory cell A is in its conduction state. In other words, one of the memory cells A and B is set to correspond to a logical state "0" while the other is set to correspond to a logical state "1" to store data.

In the memory cell B of the present invention, although the both of the pair of low-concentration diffused layers 3 are not provided, either one of the pair may be provided as necessary.

Explanation will next be made as to how to fabricate the memory cells A and B of FIGS. 1A and 1B by referring to FIGS. 2A to 5B wherein FIGS. 2A, 3A, 4A and 5A show steps of fabricating the memory cell A and FIGS. 2B, 3B, 4B and 5B show steps of fabricating the memory cell B respectively.

Figure 2A:
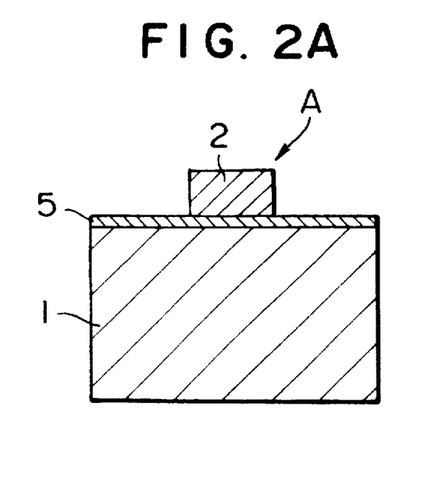
FIGS. 2A and 2B are schematic cross-sectional views of first steps of fabricating the two types of memory cells in FIGS. 1A and 1B.
Figure 2B:
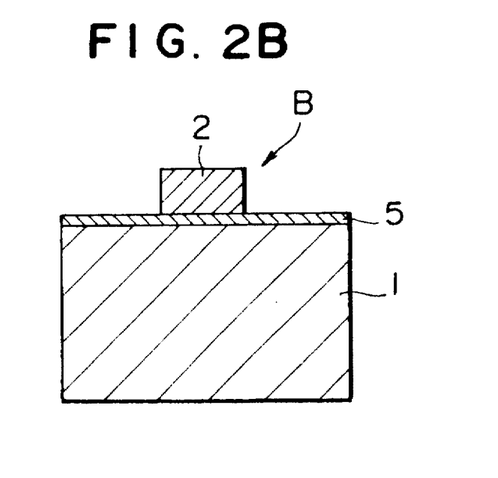

As shown in FIGS. 2A and 2B, a P type silicon substrate 1 having a resistivity of about 10 Ω·cm is first subjected to a predetermined element isolation or separation and then subjected on its surface to a thermal oxidation to form a gate oxide film 5 having a thickness of about 100–200 Å. Next, the resultant substrate is deposited on its entire surface to form a polycrystalline silicon film of about 1000–4000 Å thick, the polycrystalline silicon film is subjected to photolithography and anisotropic etching processes to obtain a pattern of lines having a width of 0.8 μm or less therebetween and form a gate electrode 2.

Figure 3A:
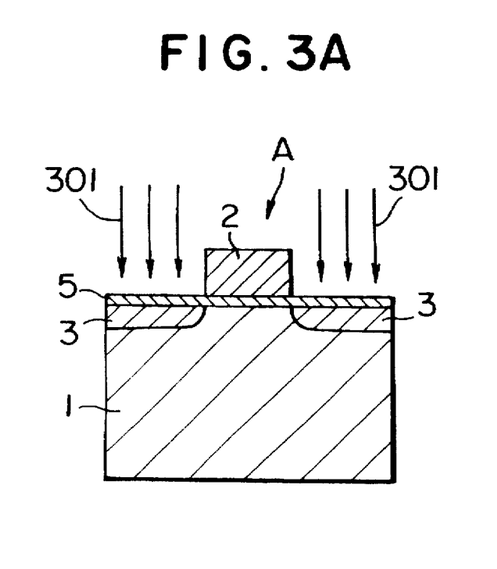
FIGS. 3A and 3B are schematic cross-sectional views of second steps of fabricating the two types of memory cells in FIGS. 1A and 1B.
Figure 3B:
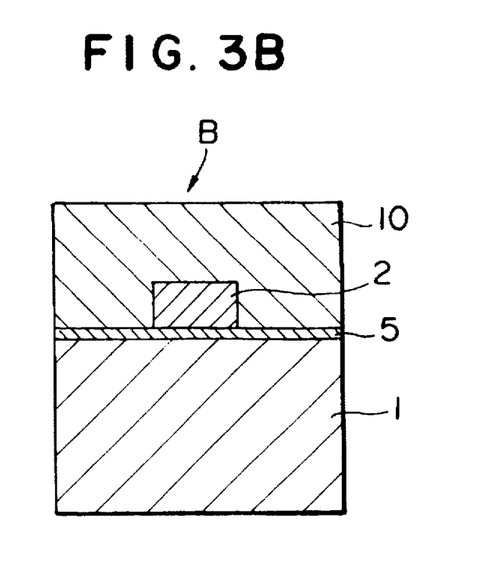

On the side of a memory cell B, as shown in FIG. 3B, the entire element region, including the gate electrode 2, is covered with a photo resist 10. In such a condition, as shown in FIG. 3A, the substrate is subjected to an ion implantation process 301 to introduce N type impurity ions into only the regions located at both sides of the gate electrode 2 with a relatively low concentration and to form N type low-concentration diffused layers 3 therein. When phosphorus is employed as the impurity, the conditions of the ion implantation process 301 are set to have an implantation energy of 20 KeV and a dosage of about $4.0\times10^{13}/cm^2$. The N type low-concentration diffused layers 3 are required to have an impurity concentration of only about $10^{19}/cm^3$ or less. When it is desired to form only one of the low-concentration diffused layers 3 in the memory cell B, only the element region of the memory cell B in which provision of the low-concentration diffused layers 3 is not desired, is covered with the photo resist 10 and then the substrate is subjected to the ion implantation process 301.

Figure 4A:
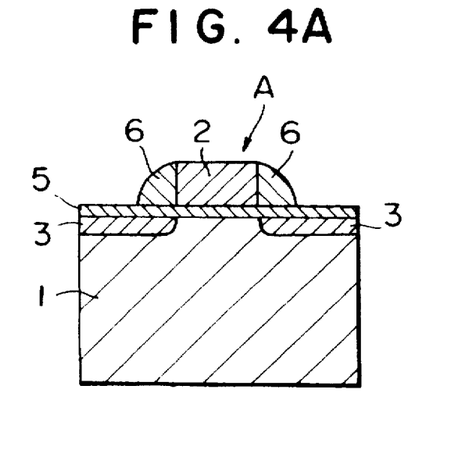
FIGS. 4A and 4B are schematic cross-sectional views of third steps of fabricating the two types of memory cells in FIGS. 1A and 1B.
Figure 4B:
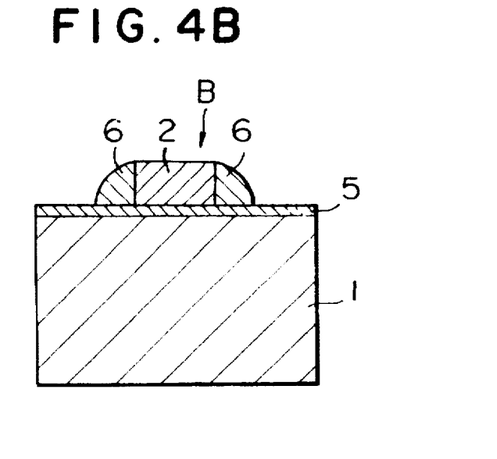

As shown in FIGS. 4A and 4B, the resultant substrate is subjected to a removing process of the photo resist 10 and then to a chemical vapor deposition (CVD) process to deposit a silicon oxide film all thereover, and the silicon oxide film is subjected to an anisotropic etching process for etch-back to form side wall insulating films 6 on both sides of the gate electrode 2. In this case, the formation width of the side wall insulating films 6 can be controlled by controlling the deposited thickness of the silicon oxide film.

Figure 5A:
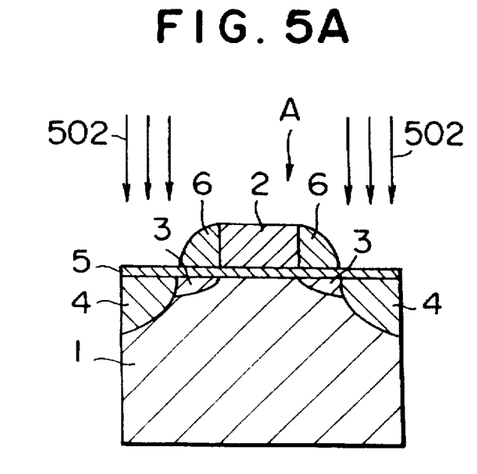
FIGS. 5A and 5B are schematic cross-sectional views of fourth steps of fabricating the two types of memory cells in FIGS. 1A and 1B.
Figure 5B:
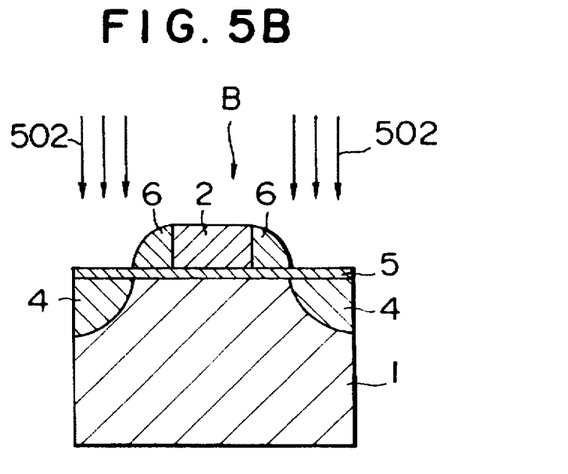
Figure 6A:
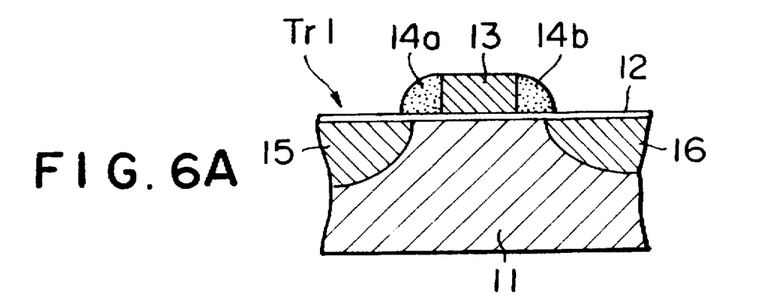
FIGS. 6A to 6D are schematic cross-sectional views of four types of n-channel transistors having different structures wherein multiple values can be stored in a single memory cell in accordance with a second embodiment of the present invention.
Figure 6B:
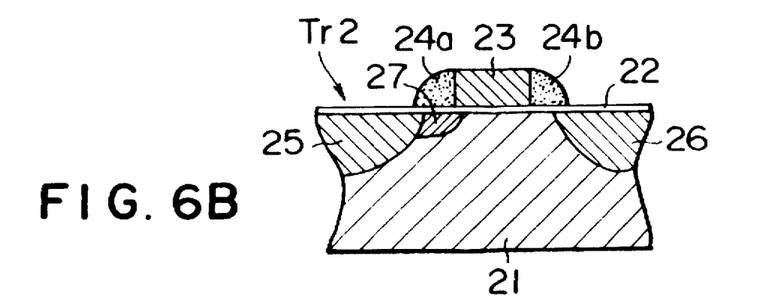
Figure 6C:
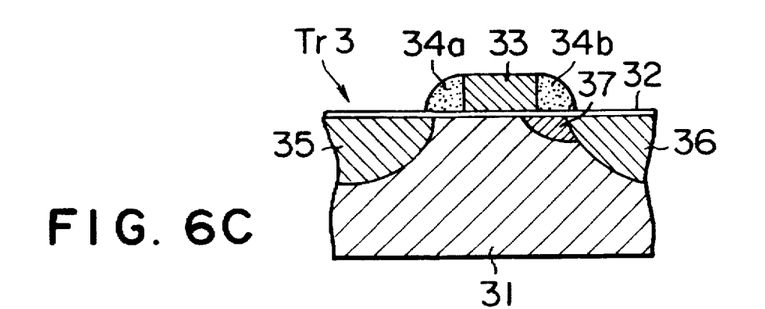
Figure 6D:
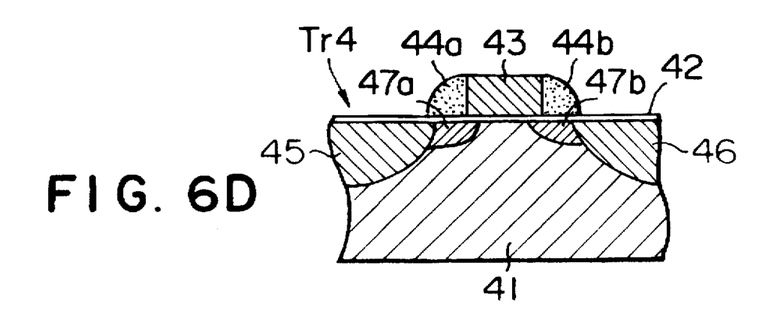

Thereafter, as shown in FIGS. 5A and 5B, the resultant substrate is subjected to a relatively high concentration of ion implantation process 502 with use of the gate electrode 2 and side wall insulating films 6 as a mask and also with use of N type impurity ions to form high-concentration diffused layers 4 in each of the memory cells A and B. The substrate is then subjected to a thermal annealing process to activate the low-concentration diffused layers 3 of the memory cell A and the high-concentration diffused layers 4 of the memory cells A and B. When phosphorus is used as the impurity, the conditions of the ion implantation process 502 are set to have an implantation energy of 20 KeV and a dosage of about $4.0\times10^{15}/cm^2$. The high-concentration diffused layers 4 are required only to have an impurity concentration of about $10^{20}/cm^3$ or higher.

Then, as shown in FIG. 1A and 1B, the resultant substrate is subjected to a CVD process to deposit an interlayer insulating film 9 made of a phospo-silicate glass (PSG) or the like film thereon, and subjected to an anisotropic etching process to partially expose the high-concentration diffused layers 4, and then aluminum (Al) wirings 8 added by Cu or Si are formed to the high-concentration diffused layers 4. Further, a protection film 7, such as a silicon nitride film, is formed all over the surface of the resultant substrate.

Through the above steps, two types of memory cells A and B corresponding to different logical states can be fabricated. That is, the steps subsequent to the steps of FIGS. 3A and 3B are carried out on the different given program data to form different types of memory cells A and B, whereby the contents of the given program can be stored therein.

The system of the present embodiment can provide a integration (components per chip) higher than the system (1). In the case of the system wherein programming is carried out depending on the presence or absence of contacts to the source/drain, there is employed a NOR type circuit configuration wherein MOS transistors of memory cells are arranged in parallel because completely nonconductive memory cells are formed. However, this NOR type system is disadvantageous in that it is lower in integration density (components per chip) than a NAND type system having MOS transistors arranged in series. The aforementioned system of the present embodiment, in which programming is carried out by changing a threshold voltage, can employ the NAND type circuit configuration, thus realizing its increased integration. Further, in the system of the present embodiment, since the program step is located in the latter part of the fabrication steps when compared with the aforementioned systems (2) and (3), the TAT is short. The system of the present embodiment can employ the NAND type circuit configuration since programming is carried out depending on the presence or absence of the low-concentration impurity diffused layer of an LDD structure, while the system wherein programming is carried out without formation of the impurity diffused layers of MOS transistors of specific memory cells at all must employ an NOR type circuit configuration since fully-nonconductive memory cells are formed as in the aforementioned system (1). When no impurity diffused layers are formed an ion implantation mask must be twice more, increasing the number of steps. For the above-mentioned reasons, according to the present embodiment, programming can be simply and reliably carried out while making the most of the feature of the LDD structure of being able to prevent change of the threshold voltage as time passes or deterioration of the mutual conductance caused by the shortened channel in the memory cell A.

The first embodiment of the present invention has been explained above but the present invention is not limited to the specific embodiment. For example, when arsenic or antimony is used in place of phosphorus as the impurity to be introduced into the low-concentration diffused layers 3 and high-concentration diffused layers 4, a very shallow junction can be formed. Further, an impurity to be introduced into the low-concentration diffused layers 3 may be different from an impurity to be introduced into the high-concentration diffused layers 4. Furthermore, when the gate electrode 2 is made of silicide or polycide instead of the polycrystalline silicon, its sheet resistance can be reduced. When the gate insulating film is made of an oxide nitride film in place of the silicon oxide film, hot carrier tolerance and so on can be improved. In addition, the side wall insulating film 6 may be made of a silicon nitride film in place of the silicon oxide film.

In accordance with the first aspect of the present invention, since ion implantation is selectively carried out upon formation of the LDD structure of the MOS transistors of the memory cells to store data therein on the basis of the presence or absence of the low-concentration impurity diffused layer of the LDD structure, programming can be realized with a simple step, the TAT can be made relatively short, and a high integration can be realized.

Figure 7:
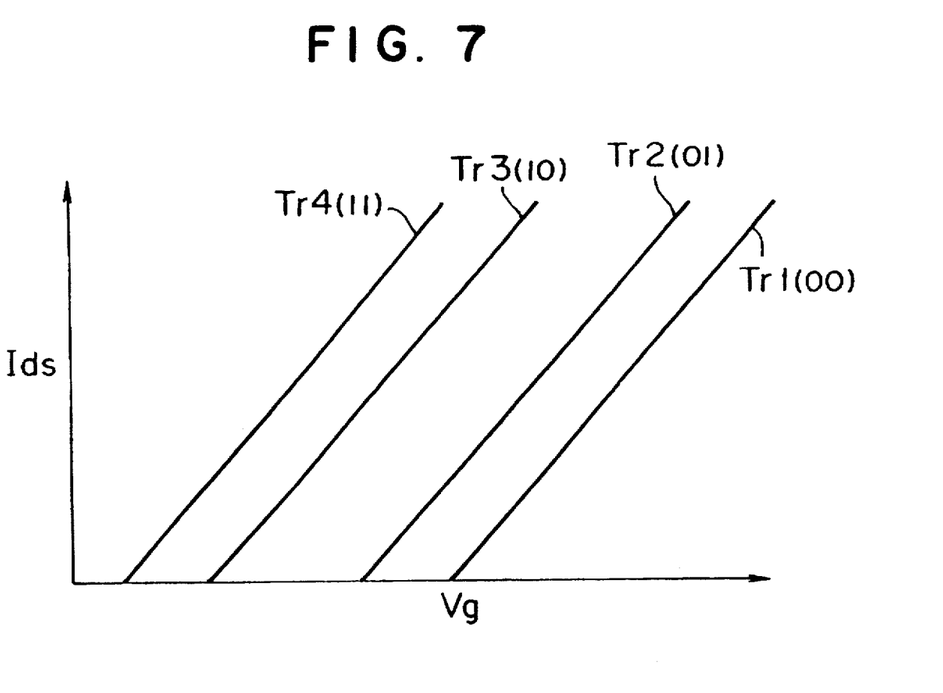
FIG. 7 is a graph showing electrical characteristics of the four types of n-channel transistors shown in FIGS. 6A to 6D.
Figure 8A:
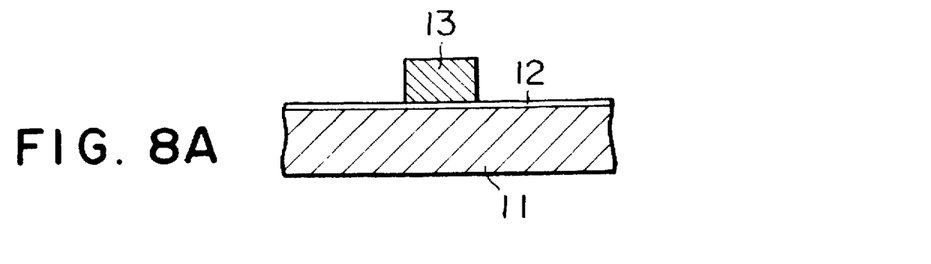
FIGS. 8A to 8D are schematic cross-sectional views of initial stage steps of fabricating the four types of n-channel transistors of FIGS. 6A to 6D.
Figure 8B:
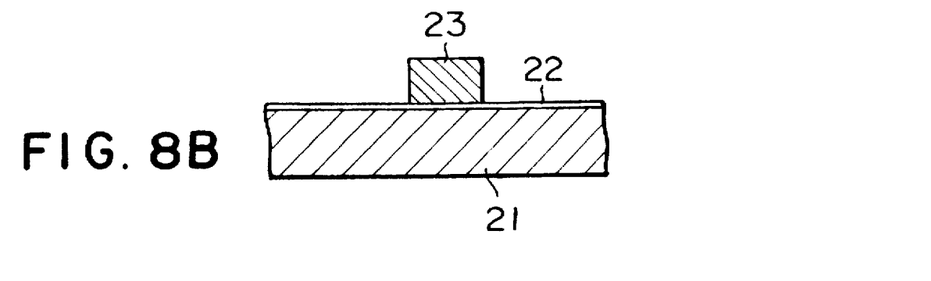
Figure 8C:
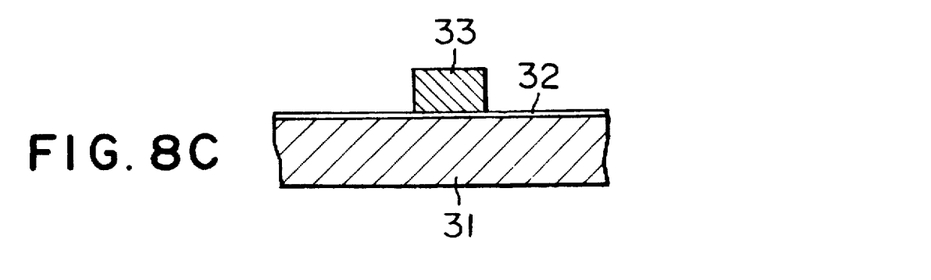
Figure 8D:
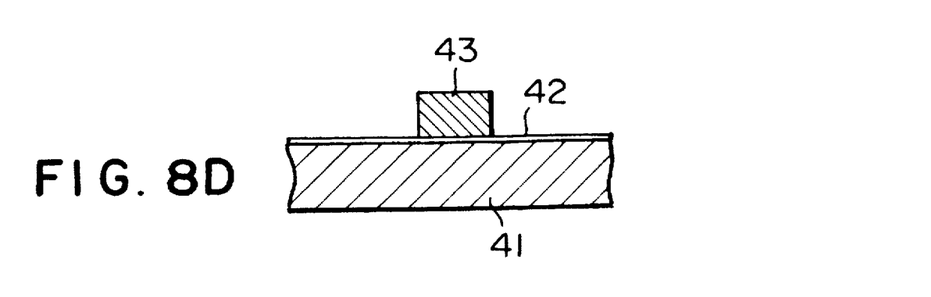
Figure 9A:
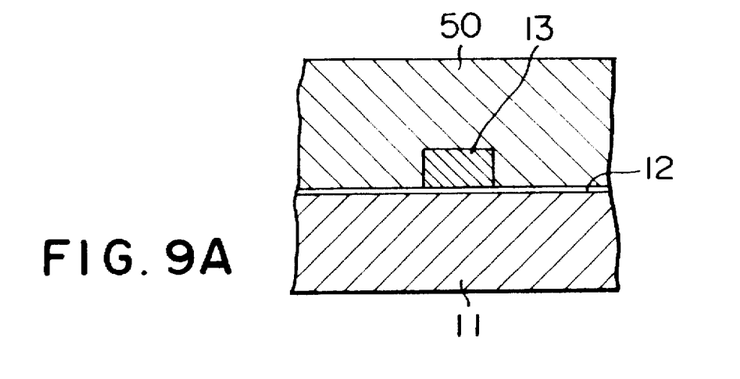
FIGS. 9A to 9D are schematic cross-sectional views of intermediate stage steps of fabricating the four types of n-channel transistors of FIGS. 6A to 6D.
Figure 9B:
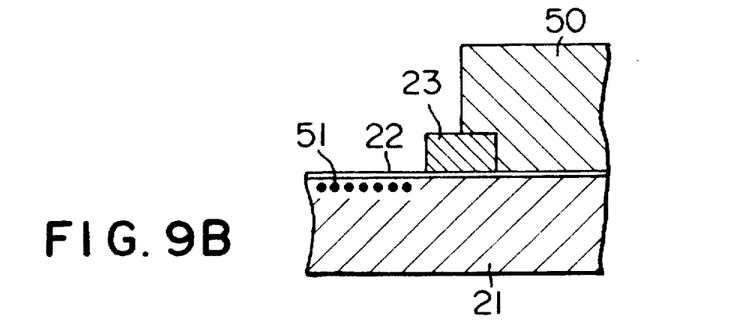
Figure 9C:
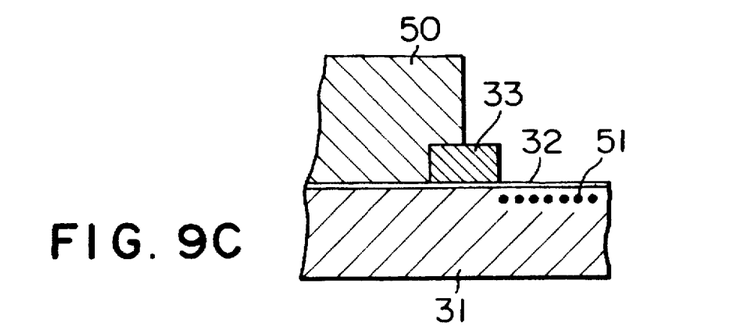
Figure 9D:
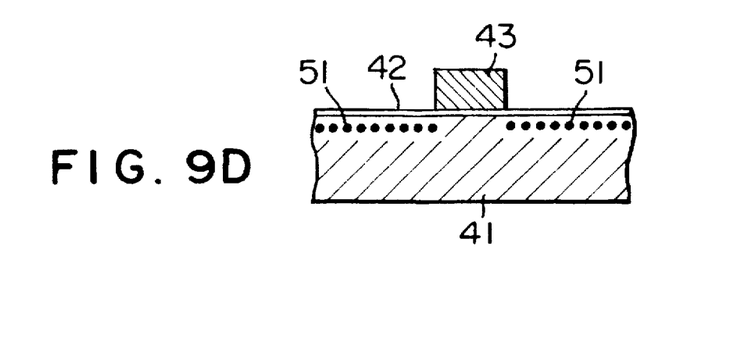
Figure 10A:
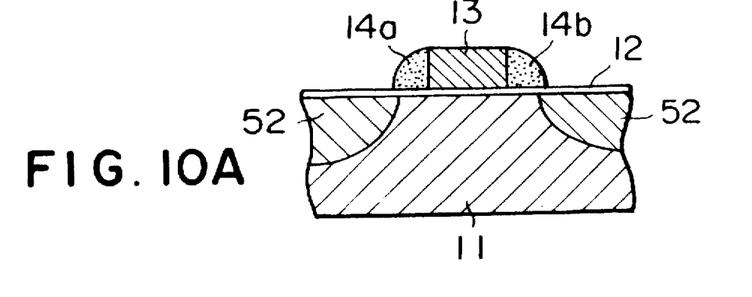
FIGS. 10A to 10D are schematic cross-sectional views of latter stage steps of fabricating the four types of n-channel transistors of FIGS. 6A to 6D.
Figure 10B:
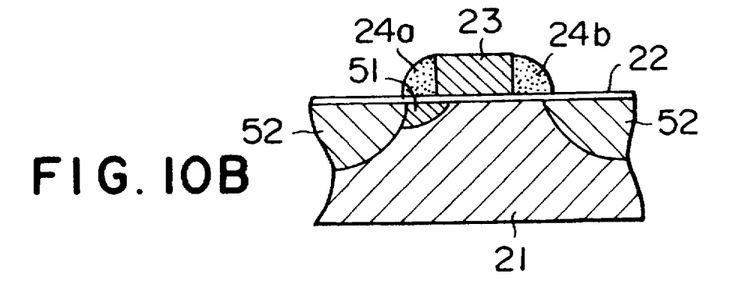
Figure 10C:
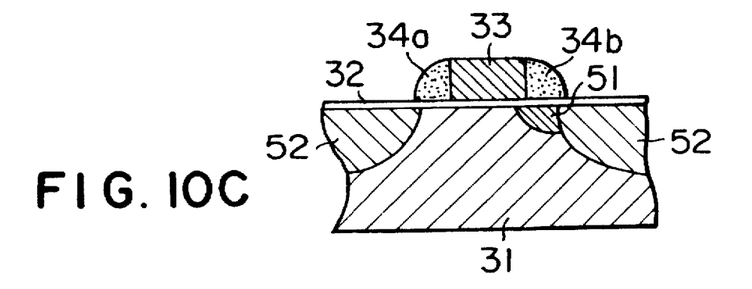
Figure 10D:
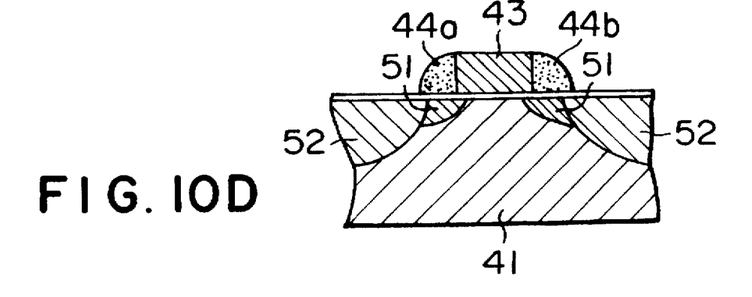

Explanation will next be made as to a second embodiment of the present invention by referring to the accompanying drawings. FIGS. 6A to 6D are schematic cross-sectional views of four types of n-channel transistors of different structures which allow so that multiple values to be stored in a memory cell; FIG. 7 is a graph showing electrical characteristics of the four types of n-channel transistors of FIGS. 6A to 6D; FIGS. 8A–8D, 9A–9D, and 10A–10D are schematic cross-sectional views of steps for fabricating the four types of n-channel transistors of FIGS. 6A to 6D in order. In these drawings, reference symbols A, B, C and D correspond to FIGS. 6A to 6D respectively. In each of FIGS. 6A to 6D, 8A to 8D, and 9A to 9D, a source is assumed to be formed on a left side and a drain is on a right side.

As shown in FIGS. 6A to 6D, each of four types of n-channel transistors Tr1 to Tr4 include p type semiconductor substrates 11, 21, 31, and 41, gate insulating films 12, 22, 32, and 42, gate electrodes 13, 23, 33, and 43, side walls 14a and 14b, 24a and 24b, 34a and 34b, and 44a and 44b, N+ type source-side impurity diffused layers 15, 25, 35, and 45, N+ type drain-side impurity diffused layers 16, 26, 36, and 46.

Further, each of the transistors Tr2 to Tr4 other than the transistor Tr1 have low-concentration impurity diffused layers of an N− conduction type (which will be referred to as the LDD layers, hereinafter) 27, 37, 47a, and 47b in their active regions. With respect to the LDD layers 27, 37, 47a, and 47b, the LDD layer 27 forms a part of the source-side impurity diffused layer 25 on the source side (27) in the transistor Tr2, the LDD layer 37 forms a part of the drain-side impurity diffused layer 36 on the drain side (37) in the transistor Tr3, and the LDD layers 47a and 47b form parts of the impurity diffused layers 45 and 46 on the source side (47a) and on the drain side (47b) in the transistor Tr4.

FIG. 7 plots Vg-Ids characteristics of the transistor Tr1 having no LDD layer on either side, transistor Tr2 having the LDD layer formed on the source side, transistor Tr3 having the LDD layer formed on the drain side, and transistor Tr4 having the LDD layers formed on the both sides, wherein x-axis denotes gate voltage Vg and y-axis denotes drain-source current Ids. It will be seen from the drawing that, when the same gate voltage Vg is applied to the four types of transistors of 6A to 6D, different currents Ids flow through the four types of transistors.

In other words, when the value of the current Ids of any one of the transistors applied with the same gate voltage is detected, the type of the corresponding transistor among the four types of FIGS. 6A to 6D can be identified by the graph of FIG. 3 based on the detected value. Accordingly, when 2-bit data "00", "01", "10", and "11" are previously set to correspond to the transistors Tr1, Tr2, Tr3, and Tr4, respectively, for example and when memory cells are made of such transistors Tr1 to Tr4 on the basis of data to be stored therein, there can be obtained a multi-valued mask ROM wherein 2-bit data is stored in one memory cell. When it is desired to read out the data from the multi-valued mask ROM, the constant voltage Vg is applied to the cell transistor to detect the value of the current Ids.

For the purpose of clearly identifying the transistor type, it is desirable that the values of the currents Ids of the respective transistors are as different so that values can be sufficiently discriminated from each other. The value of the current Ids can be controlled by suitably changing the impurity concentration of the source regions 15, 25, 35, 45 and drain regions 16, 26, 36, 46 as well as the impurity concentration of the LDD layer 27 and so on. In the present embodiment, in view of the above respect, the impurity concentration of the LDD layer is set to be $10^{18}/cm^3$ or less and the impurity concentration of the source and drain regions is to be $10^{19}/cm^3$ or more.

An explanation will next be given as to how to differently fabricate the four types of transistors Tr1 to Tr4 as shown in FIG. 6A to 6D, by referring to FIGS. 8A–8D, 9A–9D and 10A–10D. As in FIGS. 6A to 6D, reference symbols A, B, C and D denote the transistors Tr1, Tr2, Tr3 and Tr4 respectively.

Turning first to FIGS. 8A to 8D, P type semiconductor substrates 11, 21, 31 and 41 having a resistivity of about 10 Ω·cm are subjected to a thermal oxidation to form gate insulating films 12, 22, 32 and 42 having a thickness of about 70–150 Å on the element active region of the substrate. The resultant substrate is then subjected to a CVD process to deposit a multicrystalline silicon film of about 1000–4000 Å on the entire gate insulating film. Thereafter, the substrate is subjected to a lithographic process over the multicrystalline silicon film to form a pattern of lines having a width of 0.8 μm or less therebetween, thus forming such gate electrodes 13, 23, 33 and 43 as shown in FIGS. 8A to 8D.

Subsequently, a photo resist 50 is coated on each active region and then is subjected to a selective exposure depending on the type of the transistor to be fabricated. The exposure pattern corresponds to the contents of the program. After the photo resist is partially exposed (or not exposed depending on the type of the photo resist), such a partial photo resist 50 as shown in FIGS. 9A to 9D is left. The active regions of the transistors are masked with different patterns corresponding to the types of the respective transistors. That is, the transistor Tr1 is fully masked, the transistor Tr2 is masked only on its drain side (right side), the transistor Tr3 is masked only on its source side (left side), and the transistor Tr4 is not masked on either side. Such differences in how to mask correspond to differences in 2-bit data to be recorded.

Under such a condition, the resultant substrate is subjected to an ion implantation with use of P ions under conditions that a dosage is about $4 \times 10^{12}/cm^2$ and an energy level is about 20 KeV. P ions are implanted only into the areas not masked to thereby form a low-concentration impurity layer 51 on the ion-implanted areas of the p-type substrate.

Subsequently, the photo resist 50 used as the mask is removed. The resultant substrate is subjected to a CVD process to deposit an $SiO_2$ film and then to an etch-back process to form side walls 14a and 14b, 24a and 24b, 34a and 34b, and 44a and 44b on both sides of the gate electrodes 13, 23, 33, and 43 respectively, as shown in FIG. 10A to 10D.

P ions are again implanted into the p-type semiconductor substrate with an increased dosage of about $4 \times 10^{20}/cm^2$ and an energy level of about 20 KeV. In this case, the respective side walls on both sides of the gate electrodes are used as the respective masks so that a high-concentration impurity layer 52 is formed on the areas of the substrate not masked. Thereafter, the low-concentration impurity layer 51 and high-concentration impurity layer 52 are subjected to an annealing process so that $N^-$ type LDD layers 27, 37, 47a, 47b, $N^+$ type source-side impurity diffused layers 15, 25, 35, 45, and $N^+$ type drain-side impurity diffused layers 16, 26, 36, 46 are formed in the respective transistors Tr1 to Tr4 as shown in FIGS. 6A to 6D, the LDD layers having an impurity concentration of $10^{18}/cm^3$ or less and the source- and drain-side impurity diffused layers having an impurity concentration of $10^{19}/cm^3$ or more.

Through the above steps, there is formed a major part of the four types of n-channel transistors for use in a multi-valued memory mask ROM. The respective transistors correspond to 2-bit data depending on the presence/absence and location of the LDD layer(s). Accordingly, when such transistors as mentioned above are arranged in a matrix form and wired in a predetermined relation, there can be obtained a multivalued, mask programmable ROM.

The present invention is not restricted to the above embodiments and can be modified in various ways without departing from the spirit and scope of the invention. For example, although the transistors of the memory cells have been made of the n-channel type in the foregoing embodiment, the present invention is not limited to the specific example but the memory cells may be made of a p-channel type. In the latter case, the conduction type of the LDD layers is made to be $P^-$ type. How to make correspondence between the transistors and 2-bit data is not restricted to the specific method of the foregoing embodiment but any suitable method may be employed.

As has been explained in the foregoing, in accordance with the second aspect of the present invention, there can be formed first to fourth types of transistors which are slightly different from each other in simple structure and have different electrical characteristics and can be provided a multivalued storage semiconductor memory in which the first to fourth type transistors are assigned to respective memory cells so that 2-bit data can be recorded in one memory cell.

Since the differences in structure between the first to fourth transistors are based on the presence/absence and location of the low-concentration impurity layer(s) in the channel region, such four types of transistors having such structural differences therebetween can be made in the same number of steps as ordinary transistors. Further, since the element active regions of each transistor have an identical width that is the same as that of the ordinary transistors, high miniaturization and integration can be realized to the same extent as the ordinary transistors. Therefore, when such transistors are used as memory cells, there can be provided a method for fabricating a multivalued semiconductor memory which allows high integration with low costs.

What is claimed is:

1. A semiconductor memory comprising:

a first memory cell including a first MOS transistor having a pair of first impurity diffused layers of a second electric conduction type, which have relatively high concentration and are provided within a semiconductor substrate of a first electric conduction type at both sides of a gate electrode, and also having a pair of second impurity diffused layers of the second electric conduction type which have relatively low concentration and are provided within the semiconductor substrate inside said pair of first impurity diffused layers;

a second memory cell including a second MOS transistor having said pair of first impurity diffused layers and only one of said pair of second impurity diffused layers; and a third memory cell including a third MOS transistor having said pair of first impurity diffused layers and neither of said pair of second impurity diffused layers.

2. A semiconductor memory as set forth in claim 1, wherein said first impurity diffused layer has an impurity concentration of $10^{20}$/cm$^3$ or more and said second impurity diffused layer has an impurity concentration of $10^{19}$/cm$^3$ or less.

3. A semiconductor memory as set forth in claim 1, wherein said first to third MOS transistors are n-channel transistors.

4. A semiconductor memory as set forth in claim 1, wherein said first to third MOS transistors are p-channel transistors.

5. A semiconductor memory as set forth in claim 1, wherein said first impurity diffused layer of said first to third MOS transistors has impurity concentration of $10^{20}$/cm$^3$ or more and said second impurity diffused layer of said first to second MOS transistors has impurity concentration of $10^{19}$/cm$^3$ or less.

6. A semiconductor memory as set forth in claim 1, wherein said first MOS transistor represents 2-bit data "11", said second MOS transistor represents 2-bit data "10" or "01", said third MOS transistor represents 2-bit data "00".

7. A multivalued semiconductor memory comprising:

a first transistor having a low concentration impurity diffused layer only in a source side of a channel region;

a second transistor having a low concentration impurity diffused layer only in a drain side of a channel region;

a third transistor having low concentration impurity diffused layers in source and drain sides of a channel region; and a fourth transistor not having any low concentration impurity diffused layer in either of source and drain sides of a channel region;

wherein one of said first to fourth transistors is selected to make up a memory cell which stores 2-bit data.

8. A multivalued semiconductor memory as set forth in claim 7, wherein said low concentration impurity diffused layer has impurity concentration lower than that of a source or drain.

9. A multivalued semiconductor memory as set forth in claim 7, wherein said first to fourth transistors are n-channel transistors.

10. A multivalued semiconductor memory as set forth in claim 7, wherein said first to fourth transistors are p-channel transistors.

11. A multivalued semiconductor memory as set forth in claim 7, wherein said low concentration impurity diffused layer of said first to third transistors has impurity concentration of $10^{19}$/cm$^3$ or less and source and drain regions of said first to fourth transistors have impurity concentration of $10^{20}$/cm$^3$ or more.

12. A multivalued semiconductor memory as set forth in claim 7, wherein said first transistor represents 2-bit data "01", said second transistor represents 2-bit data "10", said third transistor represents 2-bit data "11", and said fourth transistor represents 2-bit data "00".

* * * * *